(12) United States Patent
Hageman et al.

(10) Patent No.: US 12,619,160 B2
(45) Date of Patent: May 5, 2026

(54) SYSTEMS AND METHODS FOR REDUCING PATTERN SHIFT IN A LITHOGRAPHIC APPARATUS

(71) Applicant: ASML NETHERLANDS B.V., Veldhoven (NL)

(72) Inventors: Joost Cyrillus Lambert Hageman, Eindhoven (NL); Marie-Claire Van Lare, Veldhoven (NL); Hans Van Der Laan, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 176 days.

(21) Appl. No.: 18/712,176

(22) PCT Filed: Nov. 9, 2022

(86) PCT No.: PCT/EP2022/081291
§ 371 (c)(1),
(2) Date: May 21, 2024

(87) PCT Pub. No.: WO2023/104419
PCT Pub. Date: Jun. 15, 2023

(65) Prior Publication Data
US 2025/0021018 A1 Jan. 16, 2025

(30) Foreign Application Priority Data

Dec. 8, 2021 (EP) ..................................... 21213192

(51) Int. Cl.
*G03F 7/00* (2006.01)

(52) U.S. Cl.
CPC ...... *G03F 7/70516* (2013.01); *G03F 7/70141* (2013.01); *G03F 7/7025* (2013.01);
(Continued)

(58) Field of Classification Search
CPC ............. G03F 7/70516; G03F 7/70141; G03F 7/7025; G03F 7/70258; G03F 7/70358;
(Continued)

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |

(Continued)

FOREIGN PATENT DOCUMENTS

| | | |
|---|---|---|
| WO | 2006/097135 | 9/2006 |
| WO | 2016/050584 | 4/2016 |

OTHER PUBLICATIONS

International Search Report and Written Opinion issued in corresponding PCT Patent Application No. PCT/EP2022/081291, dated Jan. 25, 2023.

*Primary Examiner* — Steven H Whitesell
(74) *Attorney, Agent, or Firm* — Pillsbury Winthrop Shaw Pittman, LLP

(57) ABSTRACT

A method for improving imaging of a feature on a mask to a substrate during scanning operation of a lithographic apparatus. The method includes obtaining a dynamic pupil representing evolution of an angular distribution of radiation exposing a mask during a scanning operation of a lithographic apparatus and determining a variation of shift of a feature at a substrate during the scanning operation due to interaction of the dynamic pupil with the mask. The method includes configuring a mask parameter and/or or a control parameter of the lithographic apparatus to reduce the variation of shift of the feature.

20 Claims, 13 Drawing Sheets

(52) U.S. Cl.
CPC ...... *G03F 7/70258* (2013.01); *G03F 7/70283*
(2013.01); *G03F 7/70358* (2013.01); *G03F*
*7/70508* (2013.01); *G03F 7/70525* (2013.01);
*G03F 7/70641* (2013.01); *G03F 7/70666*
(2013.01); *G03F 7/706837* (2023.05); *G03F*
*7/70725* (2013.01)

(58) Field of Classification Search
CPC ............. G03F 7/70508; G03F 7/70525; G03F
7/70641; G03F 7/70666; G03F 7/706837;
G03F 7/70725; G03F 7/70133; G03F
7/70283; G03F 7/70425
See application file for complete search history.

(56) References Cited

U.S. PATENT DOCUMENTS

| | | | |
|---|---|---|---|
| 5,523,193 A | | 6/1996 | Nelson |
| 5,969,441 A | | 10/1999 | Loopstra et al. |
| 7,587,704 B2 | | 9/2009 | Ye et al. |
| 7,623,220 B2 * | | 11/2009 | Granik ................ G03F 7/70441 |
| | | | 355/71 |
| 8,200,468 B2 | | 6/2012 | Ye et al. |
| 9,804,499 B2 * | | 10/2017 | Deguenther ........ G03F 7/70083 |
| 2009/0185154 A1 * | | 7/2009 | Tanitsu ............... G03F 7/70108 |
| | | | 355/68 |
| 2017/0329235 A1 * | | 11/2017 | Hsu ..................... G03F 7/70441 |
| 2018/0120709 A1 * | | 5/2018 | Hsu ..................... G03F 7/70125 |
| 2020/0249578 A1 * | | 8/2020 | Hsu ..................... G03F 7/70091 |
| 2022/0390832 A1 * | | 12/2022 | Nath ................... G03F 7/70066 |
| 2023/0288816 A1 * | | 9/2023 | Yan ..................... G03F 7/70504 |

* cited by examiner

10A

16Ac

SYSTEMS AND METHODS FOR REDUCING PATTERN SHIFT IN A LITHOGRAPHIC APPARATUS

CROSS-REFERENCE TO RELATED APPLICATION

This application is the U.S. national phase entry of PCT Patent Application No. PCT/EP2022/081291, which was filed on Nov. 9, 2022, which claims the benefit of priority of European Patent Application No. 21213192.4 which was filed on Dec. 8, 2021 and which is incorporated herein in its entirety by reference.

TECHNICAL FIELD

The description herein relates to lithographic apparatuses and processes, and more particularly to a tool to determine and minimize mask 3D effects.

BACKGROUND

A lithographic apparatus is a machine that applies a desired pattern onto a target portion of a substrate. The lithographic apparatus can be used, for example, in the manufacture of integrated circuits (ICs). For example, an IC chip in a smart phone, can be as small as a person's thumbnail, and may include over 2 billion transistors. Making an IC is a complex and time-consuming process, with circuit components in different layers and including hundreds of individual steps. A patterning process can include a patterning step to transfer a pattern from a patterning device (such as a mask) to the substrate. The mask is a master template for a given IC design. It is placed in a lithography apparatus, which projects light through the mask. That, in turn, is used to pattern images on the substrate (often referred to as a "wafer"). Various variations (e.g., variations in a patterning process or the lithographic apparatus) can potentially limit lithography implementation for semiconductor high volume manufacturing (HVM).

The patterning device (mask) is typically a multi-layer structure having three dimensional (3D)-like features jutting out on top of the mask. In operation, when the radiation from an illumination source of the lithographic apparatus (e.g., EUV light) hits the mask at an angle (e.g., 6-degrees), the oblique incident radiation field and the 3D features, alone or in combination, may cause various effects in the lithographic projection process such as a shadowing effect or photomask-induced imaging aberrations on the wafer. These effects are commonly referred to as "Mask 3D effects" (M3D effects) and may result in unwanted feature-size dependent focus and pattern placement shifts depending on the incident illumination setting (e.g., pupil filling). Current techniques to mitigate the impact of M3D effects (pattern shifts for example) are based on the assumption that for a given illumination setting the illumination source is stationary during exposure of the features on the mask. It was found that this assumption may in some cases not be valid, the pupil filling may change dynamically during the exposure (the pupil is "dynamic"), and consequently current techniques of mitigating the impact of M3D effects may be sub-optimal.

BRIEF SUMMARY

It is an object of the invention to mitigate the impact of M3D effects for cases wherein the illumination source varies during exposure of one or more features on the mask. In particular the inventors have observed that in these cases so-called fading effects may occur leading to degradation of the quality of the features applied to the substrate. Current methods of configuring or setting up a lithographic apparatus may not account for the interaction between a dynamic pupil and the M3D effects. Current methods of M3D effect correction may consider an average pupil but not a dynamic pupil, and therefore, any potential interaction between the dynamic pupil and the M3D effects may be disregarded, thereby causing patterns to be printed on the substrate in an erroneous manner.

In an embodiment, there is provided a non-transitory computer-readable media comprising instructions that, when executed by a computer, cause the computer to execute a method for improving imaging of a feature on a mask to a substrate during a scanning operation of a lithographic apparatus. The method includes: obtaining a dynamic pupil representing evolution of an angular distribution of an intensity of radiation exposing a mask during a scanning operation of a lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

In an embodiment, there is provided a non-transitory computer-readable media comprising instructions that, when executed by a computer, cause the computer to execute a method for improving imaging of a feature on a mask to a substrate during scanning operation of a lithographic apparatus. The method includes: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

Furthermore, in an embodiment, there is provided a method for improving imaging of a feature on a mask to a substrate during a scanning operation of a lithographic apparatus. The method includes: obtaining a dynamic pupil representing evolution of an angular distribution of an intensity of radiation exposing a mask during a scanning operation of a lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

Furthermore, in an embodiment, there is provided a method for improving imaging of a feature on a mask to a substrate during scanning operation of a lithographic apparatus. The method includes: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

Furthermore, in an embodiment, there is provided an apparatus for improving imaging of a feature on a mask to a substrate during a scanning operation of a lithographic apparatus. The apparatus includes a memory storing a set of instructions; and at least one processor configured to execute the set of instructions to cause the apparatus to perform a method of: improving imaging of a feature on a mask to a substrate during a scanning operation of a lithographic apparatus. The method includes: obtaining a dynamic pupil representing evolution of an angular distribution of an intensity of radiation exposing a mask during a scanning operation of a lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

Furthermore, in an embodiment, there is provided an apparatus for improving imaging of a feature on a mask to a substrate during scanning operation of a lithographic apparatus. The apparatus includes a memory storing a set of instructions; and at least one processor configured to execute the set of instructions to cause the apparatus to perform a method of: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

BRIEF DESCRIPTION OF THE DRAWINGS

Embodiments will now be described, by way of example only, with reference to the accompanying drawings in which.

Figure 1:
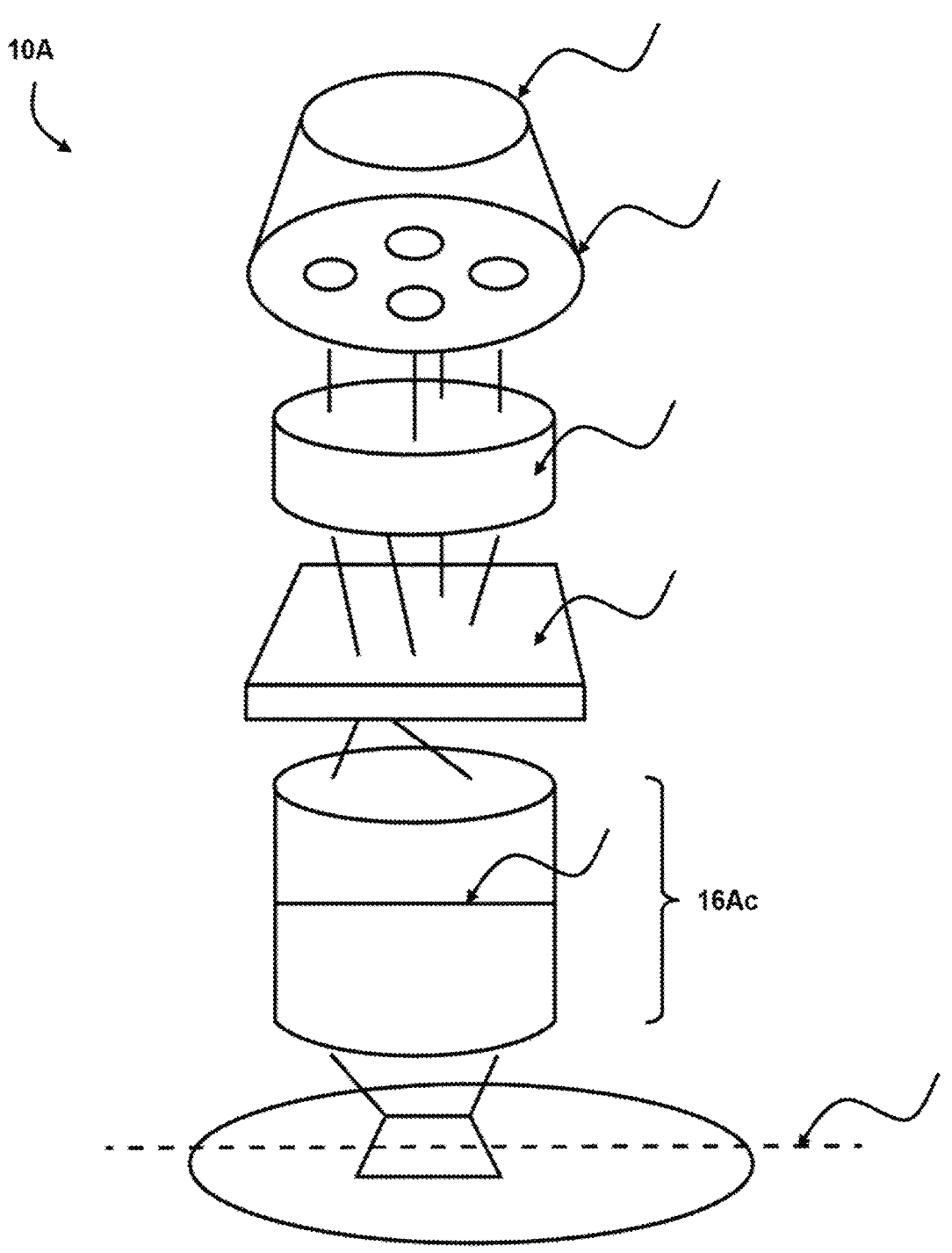
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

A lithographic apparatus is a machine that applies a desired pattern onto a target portion of a substrate. This process of transferring the desired pattern to the substrate is called a patterning process. The patterning process can include a patterning step to transfer a pattern from a patterning device (such as a mask) to the substrate. The mask is a master template for a given IC design. It is placed in a lithography scanner, which projects light through the mask. That, in turn, is used to pattern images on the substrate (often referred to as a "wafer"). Also, there can then be one or more related pattern processing steps, such as resist development by a development apparatus, baking of the substrate using a bake tool, etching the pattern onto the substrate using an etch apparatus, etc. Various variations (e.g., variations in the patterning process or the lithographic apparatus) can potentially limit lithography implementation for semiconductor high volume manufacturing (HVM).

Mask 3D effects (also referred to as "M3D effect") involve the mask. In some embodiments, the mask is a multi-layer structure having three dimensional (3D)-like features jutting out on top of the mask. In operation, when the radiation from an illumination source of the lithographic apparatus (e.g., EUV light) hits the mask at an angle (e.g., 6-degrees), the oblique incident radiation field and the 3D features, alone or in combination, may cause various effects in the lithographic projection process such as a shadowing effect or photomask-induced imaging aberrations on the wafer. This issue, known as mask 3D effects, may result in unwanted feature-size dependent focus and pattern placement shifts depending on the incident illumination position (e.g., pupil sigma). In addition, there can be large differences in focus between features that are printed simultaneously, which may limit the yield. In some embodiments, a pattern shift is a phenomenon of the pattern being printed on the wafer at a position that is displaced or shifted from its intended position due to the M3D effects. Pattern shift may include global pattern shift (all patterns shifting by essentially the same amount) or pattern-dependent pattern shift (not all patterns shifting by the same amount). Conventional techniques either do not minimize, or have drawbacks in minimizing, fading due to the M3D effects. For example, the current methods of configuring or setting up a lithographic apparatus may not account for the interaction between a dynamic pupil and the M3D effects. In some embodiments, the pupil (e.g., angular radiation intensity distribution at the mask) changes dynamically in the scanning direction (e.g., y direction). Current methods of 3D mask effect correction may consider an average pupil but not a dynamic pupil, and therefore, any potential interaction between the dynamic pupil and the M3D effects may be disregarded, thereby causing patterns to be printed on the substrate in an erroneous manner.

Disclosed are embodiments for minimizing interaction between the dynamic pupil and the M3D effects using a scan-ware optimization process. For example, the disclosed embodiments may minimize fading or contrast loss caused in aerial images, which may be caused due to a variation in pattern shifts at a substrate due to said interaction between the dynamic pupil and the M3D effects, by determining the variation in pattern shifts, and configuring one or more mask parameters or one or more control parameters of the lithographic apparatus to reduce or minimize the variation in pattern shifts. The disclosed embodiments determine a dynamic pupil in a scanning direction (e.g., a number of pupils obtained at different times in the scanning direction (e.g., slit y)), obtain corresponding aerial images for the dynamic pupil, determine a variation in a shift of a feature (e.g., pattern) at a substrate based on the individual shifts of each of the aerial images relative to their nominal position, and configure the control parameter or the mask parameter to minimize the variation in pattern shift. For example, the disclosed embodiments may configure a tilt of a reticle stage of the lithographic apparatus holding the mask to minimize the variation of pattern shift. In another example, the disclosed embodiments may configure an illumination source of the lithographic apparatus to minimize the variation of pattern shift. In another example, the disclosed embodiments may configure a projection lens of the lithographic apparatus (e.g., configure the wavefront of the projection lens as represented for example by Zernike parameters such as Z3 or Z8) to minimize the variation of the pattern shift. In yet another example, the disclosed embodiments may configure a position or movement of a wafer stage holding a substrate to minimize the variation of pattern shift. In yet another example, the disclosed embodiments may configure a bias of the mask to minimize the variation of pattern shift. In yet another example, the disclosed embodiments may configure the illumination source in addition to the mask bias to minimize the variation of pattern shift. In yet another example, the disclosed embodiments may configure one or more parameters, such as an illumination source, a reticle stage, a projection lens, a wafer stage, mask bias, or a mask design to minimize the variation of pattern shift.

As a brief introduction, FIG. 1 illustrates an exemplary lithographic projection apparatus 10A.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results or processes of lithography have more desirable characteristics, such as higher accuracy of projection of design layouts on a substrate, larger process windows, etc.

Further, the lithographic projection apparatus may be of a type having two or more substrate tables (or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges or be interdependent due to practicalities of implementations of the system. In case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. Pat. No. 8,200,468, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
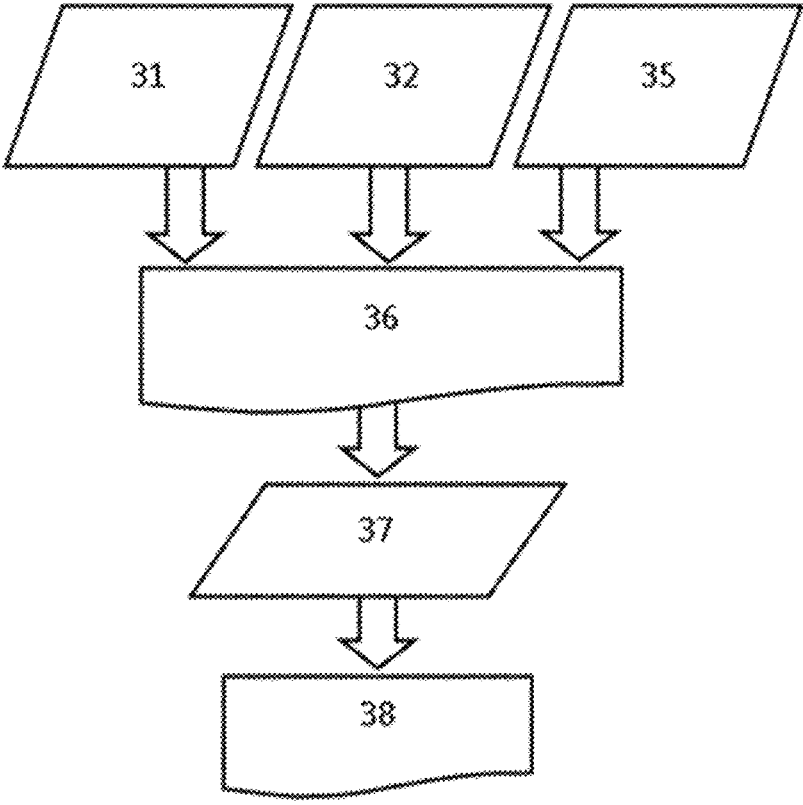
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution or phase distribution) of the source. A projection optics model 32 represents optical characteristics (including changes to the radiation intensity distribution or the phase distribution caused by the projection optics) of the projection optics. A design layout model 35 represents optical characteristics (including changes to the radiation intensity distribution or the phase distribution caused by a given design layout 33) of a design layout, which is the representation of an arrangement of features on or formed by a patterning device. An aerial image 36 can be simulated from the source model 31, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but are not limited to, NA-sigma (6) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used).

As will be appreciated by those skilled in the art, these patterns or clips represent small portions (e.g., circuits, cells or patterns) of the design and especially the clips represent small portions for which particular attention or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual method that identifies the critical feature areas.

Disclosed are embodiments for minimizing M3D effects using a scanning direction (e.g., slit y) aware optimization process. For example, the disclosed embodiments may minimize fading or contrast loss caused in aerial images, due to variation in pattern shifts at a substrate caused by interaction of the M3D effects and the dynamic pupil. For example, by determining the variation in pattern shifts, and configuring one or more mask parameters or one or more control parameters of the lithographic apparatus to minimize the variation in pattern shifts. The disclosed embodiments determine a dynamic pupil (e.g., a number of pupils obtained in a scanning direction (e.g., slit y) at different times), obtain corresponding aerial images for the dynamic pupil, determine a variation in a shift of a feature (e.g., pattern) at a substrate based on the individual shifts of each of the aerial images relative to their nominal position, and configure the control parameter or the mask parameter to minimize the variation in pattern shift.

Figure 3:
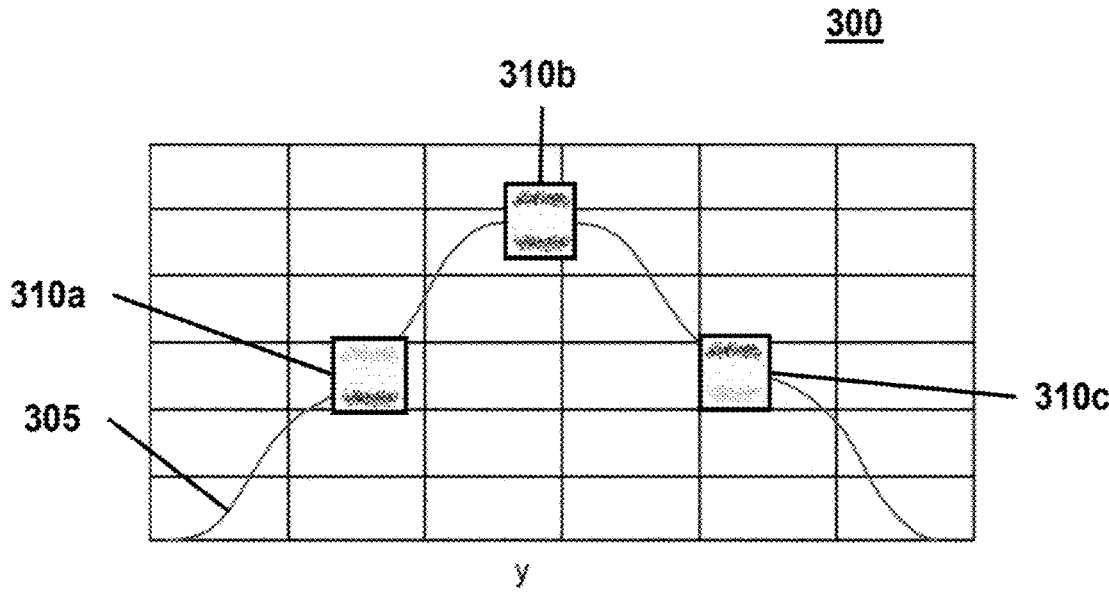
FIG. 3 shows an intensity map of an illumination source of a lithographic apparatus, consistent with various embodiments.

FIG. 3 shows an intensity map of an illumination source of a lithographic apparatus, consistent with various embodiments. As described above at least with reference to FIG. 1, the radiation from a radiation source 12A (e.g., illumination source) is projected through a mask (e.g., reticle) held on a reticle stage, which in turn, is used to print images (e.g., patterns or features associated with a mask design) on a wafer during a scanning operation. An integrated and angular distribution of the radiation at the mask evolves in a scanning direction (e.g., slit y), and this evolving angular distribution of the radiation is referred to as a "dynamic pupil". The intensity map 300 shows an integrated radiation intensity profile 305, which is a spatial variation of an integrated radiation intensity provided by the illumination source of the lithographic apparatus along a direction of scanning. The profile 305 is also associated with corresponding angular distribution of the radiation intensity (e.g., pupil). During the scanning operation, the integrated radiation intensity profile 305 is scanned along the mask 18A, and for a fixed position at the mask 18A, the profile 305 becomes a temporal variation of the angular distribution of the radiation intensity (e.g., the dynamic pupil—which is the evolution of the radiation intensity at different moments in time during a scanning operation). In the intensity map 300, the X-axis represents the scanning direction (e.g., slit y) and the Y-axis represents the radiation intensity.

The intensity map 300 also shows multiple pupils 310a-310c (e.g., dynamic pupil 310) obtained at different moments during the scanning operation. The darker the pixel as shown in the plots 310a,b,c the higher the intensity of the radiation is at the position of the pixel within the pupil plane of the illuminator. For example, a first pupil 310a is obtained at a first moment in time during the scanning operation (e.g., a time at which a fixed point on the substrate is at a first position in the scanning direction). Similarly, a second pupil 310b is obtained at a second moment in time during the scanning operation (e.g., a time at which the fixed point on the substrate is at a second position in the scanning direction), and a third pupil 310c is obtained at a third moment in time during the scanning operation (e.g., a time at which the fixed point on the substrate is at a third position in the scanning direction). As shown in the intensity map 300, the dynamic pupil 310 is evolving during the scanning operation. For example, the first pupil 310a shows the angular distribution of radiation intensity is pre-dominantly within a first angular range (e.g., corresponding to a first pole of a dipole illumination source, in this case the bottom pole) but not from a second angular range (e.g., corresponding to a second pole of the dipole illumination source). That is, at the first moment in time during the scanning operation, there is little or no radiation within the second angular range incident on the mask. Similarly, the third pupil 310c shows that the angular distribution of the radiation intensity is pre-dominantly within the second angular range but not from the first angular range. That is, at the third moment in time during the scanning operation, there is little or no radiation from the first angular range incident on the mask. The second pupil 310b depicts the angular distribution of radiation intensity from both the angular ranges (e.g., from both poles of the dipole illumination source). That is, at the second moment in time during the scanning operation, radiation from both the first angular range and the second angular range are incident on the mask.

While the foregoing description describes the dynamic pupil 310 with reference to a dipole illumination source, the dynamic pupil phenomenon can be observed with a number of types of illumination sources (e.g., quadrupoles, hexa-poles, annular, etc.) Also, at least some portions of the dynamic pupil 310 may not evolve and may remain static (e.g., do not vary or do not vary as much as remaining portions of the dynamic pupil) during the scanning operation.

The dynamic pupil 310 may have an impact on a quality or accuracy of the patterns printed on a substrate, for example, due to the interaction of the dynamic pupil 310 with the 3D mask effect associated with one or more features on the mask. The following paragraphs describe the impact at least with reference to FIG. 4.

Figure 4:
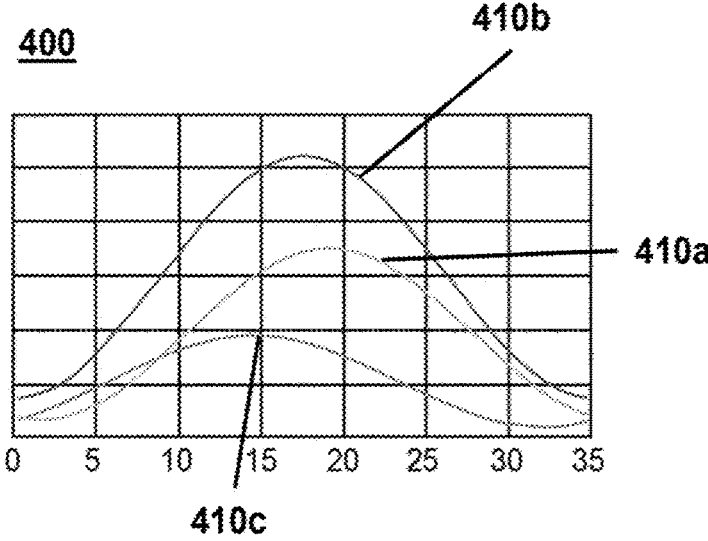
FIG. 4 shows aerial images obtained for a dynamic pupil at different times during a scanning operation, consistent with various embodiments.
Figure 4:
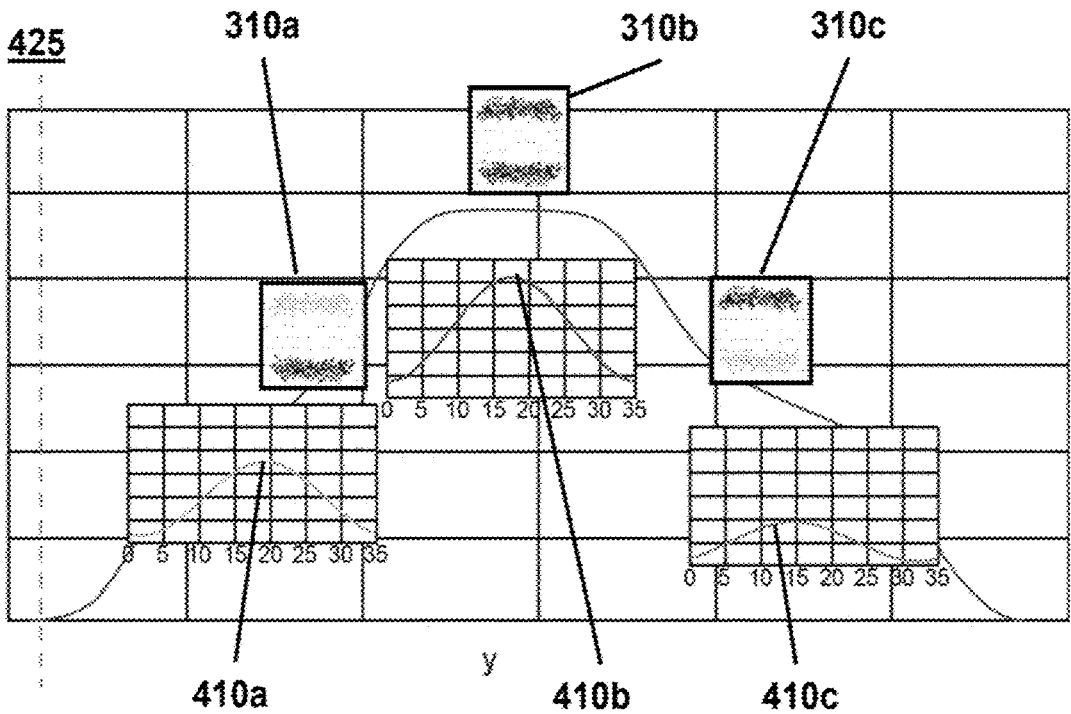

FIG. 4 shows aerial images obtained for the dynamic pupil at different times during the scanning operation, consistent with various embodiments. As described above at least with reference to FIG. 2, an aerial image is a spatial radiation intensity distribution corresponding to the image of a pattern on the mask when measured at substrate level. The aerial images depicted in FIG. 4 describe the aerial image intensity along a scanning direction (y). In some embodiments, the graphs 400 and 425 illustrate the aerial image intensities associated with pupils obtained at different times during the scanning operation. For example, the first aerial image 410a corresponds to the first pupil 310a and is obtained at the time the first pupil 310a is obtained. Similarly, the second aerial image 410b corresponds to the second pupil 310b and is obtained at the time the second pupil 310b is obtained. The third aerial image 410c corresponds to the third pupil 310c and is obtained at the time the third pupil 310c is obtained. In some embodiments, an aerial image may be obtained (e.g., simulated) using one or more models, such as the source model 31, the projection optics model 32 or the design layout model 35 illustrated at least with reference to FIG. 2.

As illustrated in the graph 400, the aerial images are shifted or displaced with respect to each other, meaning that at least two of them are shifted with respect to their nominal position. In some embodiments, the nominal position is determined based on the slit y position for which the second aerial image 410*b* corresponding to the second pupil 310*b* which includes distribution of radiation intensity from all angles (e.g., from all poles of an illumination source) is obtained. For example, the first aerial image 410*a* has a positive displacement (e.g., relative to the nominal position), and the third aerial image 410*c* has a negative displacement (e.g., relative to the nominal position). These shifts or displacement of aerial image intensities are due to interaction of the dynamic pupil with the M3D effect, and cause a fading, blur, or loss of contrast of the scan integrated aerial image (e.g., the scan integrated aerial image being the intensity weighted sum of the individual aerial images corresponding to their corresponding pupils 310*a*, 310*b*, and 310*c*), which may lead to a pattern or feature being printed sub-optimally. Since different aerial image intensities are shifted by different amounts, there is a variation in the pattern shifts, which leads to fading, blur, or loss of contrast of the scan integrated aerial image.

In some embodiments, the shifts in the aerial images may be determined based on a shift in a center of gravity of the aerial image relative to a nominal center of gravity (e.g., average of the center of gravity of all aerial images).

In some embodiments, the foregoing M3D effect (e.g., fading, blur, or loss of contrast) may be expressed as an image characteristic or image parameter such as a moving standard deviation (MSD). In some embodiments, the M3D effect (e.g., MSD), may be minimized by compensating these shifts in the aerial image intensities.

Figure 5:
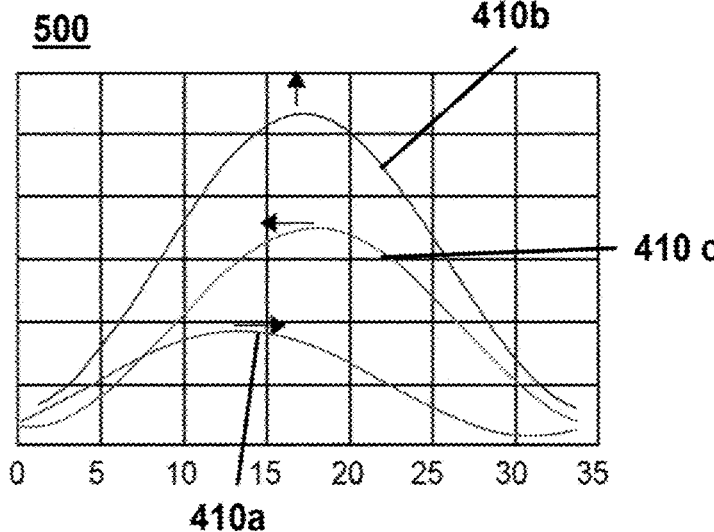
FIG. 5 is a graph illustrating compensating of aerial image displacements in the scanning direction to improve a mask 3D (M3D) effect, consistent with various embodiments.
Figure 5:
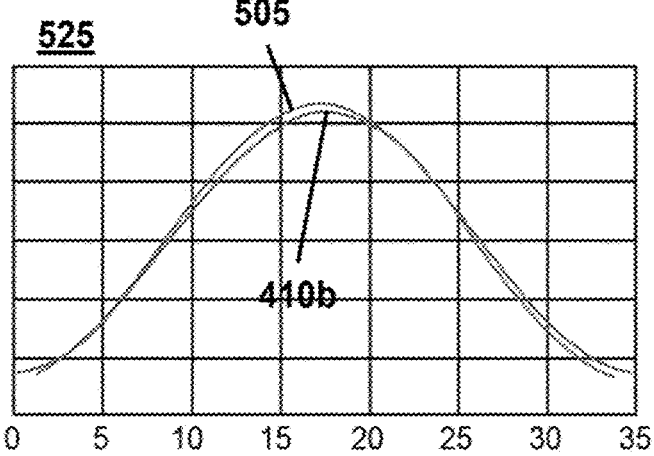

FIG. 5 is a graph illustrating compensating of aerial image displacements in the scanning direction to mitigate the fading, blurring and/or contrast loss due to the M3D effect, consistent with various embodiments. As an example, the contrast of the aerial image may be improved by shifting the aerial images 410*a* and 410*c* towards the nominal position. For example, as illustrated in the graph 500, the negative displacement of the third aerial image 410*c* may be compensated with a positive shift towards the nominal position, and the positive displacement of the first aerial image 410*a* may be compensated with a negative shift towards the nominal position to obtain an aerial image 505 that is similar to the second aerial image 410*b* as illustrated in graph 525. The aerial image 505 provides an improved contrast ratio (e.g., thereby minimizing the M3D effect).

The aerial image displacements can be compensated to minimize the pattern shift in various ways. For example, the displacement may be compensated by adjusting a tilt of the reticle stage holding the mask, thereby minimizing the variation in pattern shift at the substrate. Other methods of compensating the displacement are discussed at least with reference to FIG. 9A and FIG. 9B. In some embodiments, a tilt of the reticle stage may be computed based on the displacement of the aerial images. The displacement of the aerial image may be determined as follows:

$$\text{Pole Intensity} = \text{Aerial image intensity} * \text{Pole Fraction,} \quad \text{(Eq. A)}$$

where pole fraction is representative of an amount of

-continued
pupil corresponding to a pole of the illumination source.

$$\text{Intensity} = \sum\nolimits_{pole} \text{Pole Intensity} \quad \text{(Eq. B)}$$

$$\text{Displacement} = \quad \text{(Eq. C)}$$

$$\sum\nolimits_{pole} \text{Position per Pole} * \text{Pole Intensity where position per pole}$$

is the amount of displacement of the aerial image for that pole.

Figures 6, 7:
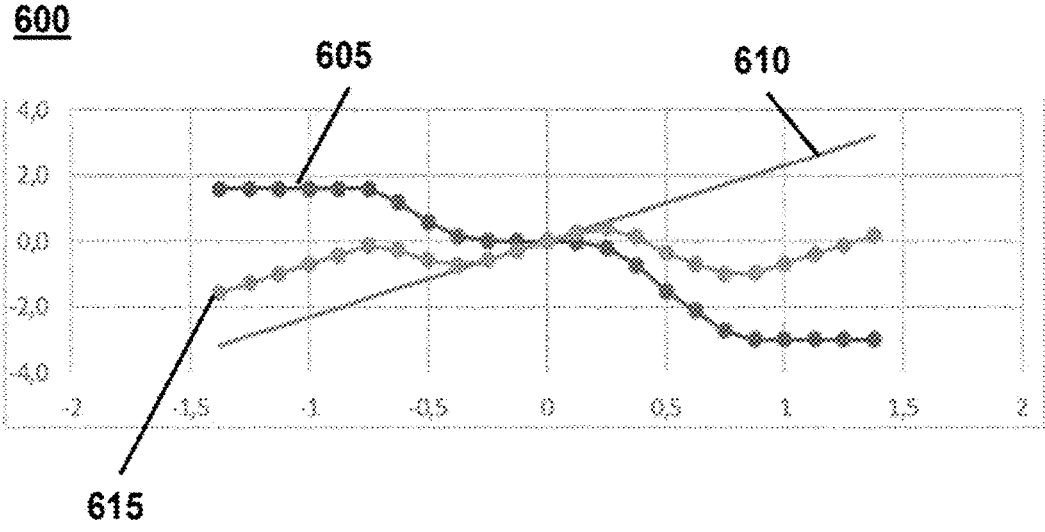
FIG. 6 is a graph illustrating a relationship between displacement and k12 (e.g., reticle stage tilt), consistent with various embodiments.
FIG. 7 is a graph illustrating a relationship between an imaging characteristic such as moving standard deviation (MSD) and k12 (e.g., reticle stage tilt), consistent with various embodiments.

The displacement of the aerial image may be compensated with a tilt of the reticle stage. In some embodiments, the tilt is determined as a function of the displacement (e.g., using one or more known methods). For example, the tilt may have a linear relationship with displacement. In some embodiments, the displacement to be compensated may be determined in terms of k12 units (e.g., overlay component) and the tilt may be determined based on the determined k12 units. In some embodiments, k12 is a polynomial expressing a certain intra-field distortion corresponding to a spatial relating between aerial image placement and location on the field (or mask). The reticle stage tilt causes projection lens aberrations, which may provide the desired k12 units for compensating the variation in shift. FIG. 6 is a graph illustrating a relationship between displacement of the aerial image along the scanning direction (for a feature of interest) and k12 (or reticle stage tilt), consistent with various embodiments. In the graph 600, the y-axis corresponds to an amount of displacement and the x-axis corresponds to the scanning direction (e.g., slit y). As illustrated in the graph 600, the displacement 605 may be compensated with a k12 610 (e.g., caused by the reticle stage tilt) to obtain an adjusted displacement 615. In some embodiments, the flatter the adjusted displacement 615 (e.g., closer to "0" on the y-axis), the lesser the displacement and lesser the variation of pattern shift at the substrate. In some embodiments, the reticle stage tilt may iteratively be adjusted until the adjusted displacement 615 is minimized.

With the above tilt, the M3D effect induced fading, contrast loss or blurring associated with the aerial image may be improved. For example, an imaging characteristic such as MSD, which is indicative of contrast loss, may be computed as follows:

$$MSD = sqrt\!\left(\sum\nolimits_{y} \text{Displacement}^2 * \text{Intensity} / \sum\nolimits_{y} \text{Intensity}\right) \quad \text{(Eq. D)}$$

By minimizing the MSD, the contrast loss is minimized. In some embodiments, minimizing the MSD is an iterative process and the tilt of the reticle stage may be continued to be adjusted or configured until the MSD is minimized.

FIG. 7 is a graph illustrating a relationship between MSD and k12 (e.g., reticle stage tilt), consistent with various embodiments. In the graph 700, the y-axis corresponds to MSD and the x-axis corresponds to k12 units (e.g., reticle stage tilt). As illustrated in the graph 700, a first curve 705 indicates that typically (e.g., without M3D effect), the MSD is "0" at "0" k12 component (e.g., no reticle stage tilt). The second curve 710 indicates a scenario with M3D effect and the MSD being minimized at a compensated displacement of a specified number of k12 units (e.g., −3 nm). Accordingly, the reticle stage tilt is configured based on the specified number of k12 units to minimize the MSD by minimizing the variation in pattern shift at the substrate.

Figure 8:
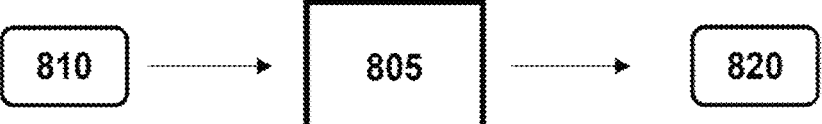
FIG. 8 is a block diagram of a system for minimizing the M3D effect using a scan-aware optimization process, consistent with various embodiments.
Figures 9A, 9B:
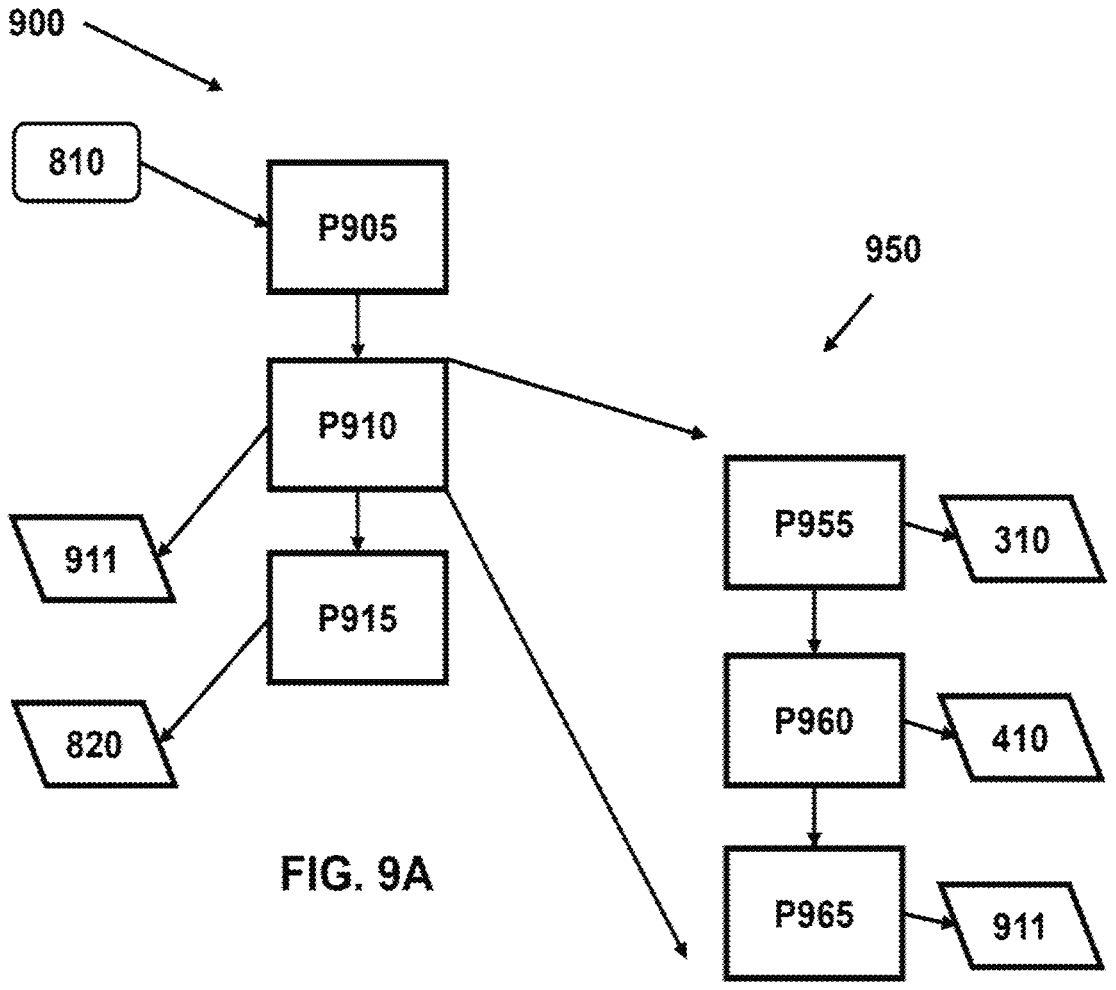
FIG. 9A is a flow diagram of a process for minimizing the M3D effect using a scan aware optimization process, consistent with various embodiments.
FIG. 9B is a flow diagram of a method for determining a variation of shift of the feature at the substrate due to M3D effects, consistent with various embodiments.

The following paragraphs describe a system and a method to minimize the M3D effects (e.g., MSD) at least with reference to FIGS. 8, 9A and 9B. FIG. 8 is a block diagram of a system for minimizing the M3D effect using a scan-aware optimization process, consistent with various embodiments. FIG. 9A is a flow diagram of a method 900 for minimizing the M3D effect using a scan aware optimization process, consistent with various embodiments.

At process P905, a configuration module 805 obtains input data 810. The input data 810 may include various data. For example, the input data 810 may include a dynamic pupil (e.g., dynamic pupil 310 of FIG. 3) representing evolution of an angular distribution of radiation exposing a mask during a scanning operation of a lithographic apparatus. The input data 810 may also include aerial images corresponding to the dynamic pupil (e.g., aerial images 410). In some embodiments, the configuration module 805 may interact with various models (e.g., source model 31, projection optics model 32, design layout model 35, or resist model 37 of FIG. 2) to obtain one or more of the input data 810.

At process P910, the configuration module 805 determines a variation of shift of a feature 911 at a substrate during the scanning operation due to interaction of the dynamic pupil with the mask. The variation of shift of the feature 911 may be determined in various ways. For example, as described at least with reference to FIGS. 3-5, the configuration module 805 may obtain a number of aerial images corresponding to a number of pupils of the dynamic pupil obtained at different times during the scanning operation (e.g., corresponding to different points in the slit y or scanning direction), and determine the variation of shift at the substrate based on individual shifts or displacements of the aerial images (associated with feature 911) relative to their respective nominal position. Additional details regarding determining the variation in shifts of the feature 911 is described at least with reference to FIG. 9B below.

At process P915, the configuration module 805 determines a process parameter 820, which may include one or more mask parameters or one or more control parameters associated with the lithographic apparatus, to be configured for minimizing the variation in shift of the feature. In some embodiments, the configuration module 805 provides various degrees of freedom in configuring the process parameter 820 for minimizing the variation of shift of the aerial images at the substrate. For example, as described at least with reference to FIGS. 6 and 7, the configuration module 805 may configure a control parameter such as a tilt of a reticle stage of the lithographic apparatus holding the mask for minimizing the variation of shift of the feature 911 at the substrate. In some embodiments, the configuration module 805 may determine an overlay error introduced due to the reticle stage tilt, and may further configure a mask parameter such as a mask design layout to compensate the overlay error. In some embodiments, the configuration module 805 may determine a focus error introduced due to the reticle stage tilt, and may further configure a control parameter such as a position or movement of a wafer stage of the lithographic apparatus holding the substrate to compensate the focus error. In another example, the configuration module 805 may configure a control parameter such as an illumination source of the lithographic apparatus to minimize the variation of shift of the feature 911. In another example, the configuration module 805 may configure a control parameter such as a projection lens (e.g., projection optics illustrated in FIG. 1) of the lithographic apparatus (e.g., Zernike parameters such as Z3 or Z8) to minimize the variation of shift of the feature 911. In some embodiments, the Zernike parameters such as Z3 or Z8 are controlled such that they compensate the pattern shift behavior in the scanning direction (e.g., slit y) caused by the interaction between the dynamic pupil and M3D effects. In some embodiments, they may also be implemented as a dynamic lens adjustment of the projection lens, such as actuating the projection lens element to impose the desired Z3(t) behavior during the scanning operation. In yet another example, the configuration module 805 may configure a mask parameter such as a bias of the mask to minimize the variation of shift of the feature 911. In yet another example, the configuration module 805 may configure a control parameter such as the illumination source in addition to a mask parameter such as the mask bias to minimize the variation of shift of the feature 911 (e.g., source mask optimization (SMO)).

FIG. 9B is a flow diagram of a method 950 for determining a variation of shift of the aerial images at the substrate due to M3D effects, consistent with various embodiments. In some embodiments, the method 950 is executed as part of process P905 or P910 of method 900. At process P955, the configuration module 805 obtains multiple pupils forming the dynamic pupil (e.g., dynamic pupil 310). In some embodiments, each pupil of the multiple pupils corresponds to an angular distribution of the intensity of the radiation at the mask, and is obtained at a different moment of the multiple moments. For example, as illustrated in FIG. 3, a first pupil 310a is obtained at a first moment in time during the scanning operation (e.g., a time at which a fixed point on the substrate is at a first position in the scanning direction (e.g., slit y)). Similarly, a second pupil 310b is obtained at a second moment in time during the scanning operation (e.g., a time at which the fixed point on the substrate is at a second position in the scanning direction), and a third pupil 310c is obtained at a third moment in time during the scanning operation (e.g., a time at which the fixed point on the substrate is at a third position in the scanning direction). In some embodiments, an aerial image may be obtained (e.g., simulated) using one or more models, such as the source model 31 illustrated at least with reference to FIG. 2

At process P960, the configuration module 805 obtains multiple aerial images for the dynamic pupil. In some embodiments, each aerial image is obtained for a different pupil of the dynamic pupil. For example, as illustrated in FIG. 4, the configuration module 805 obtains a first aerial image 410a corresponding to the first pupil 310a, a second aerial image 410b corresponding to the second pupil 310b, and a third aerial image 410c corresponding to the third pupil 310c. In some embodiments, an aerial image may be obtained (e.g., simulated) using one or more models, such as the source model 31, the projection optics model 32 or the design layout model 35 illustrated at least with reference to FIG. 2.

At process P965, the configuration module 805 determines the variation of shift of the feature based on determined individual shifts of each of the aerial images relative to their respective nominal positions. For example, as described at least with reference to FIGS. 5 and 6, the configuration determines a displacement or shift of an aerial image based on a shift in a center of gravity of the aerial image relative to a nominal center of gravity. In some embodiments, the configuration module 805 may determine the displacement of the aerial images 410 using the equations (Eq. A)-(Eq. C) above. The overall displacement of all the aerial images is indicative of the variation of shift of the feature 911 at the substrate. After, the variation of the shift of the feature 911 is determined, the method 950 returns to process P915 of the method 900 to determine the process parameter 920 to be configured for minimizing the variation of the shift of the feature 911.

While the foregoing paragraphs describe the variation of shift of the feature with reference to a feature, the embodiments are not limited to a single feature. The mask may have multiple features to be printed on the substrate, and therefore different features may have different variation of shifts. Accordingly, the configuration module 805 configures the mask parameter or the control parameter based on a combination of variation of shifts of the multiple features.

While the foregoing paragraphs describe minimizing the variation in shift of the feature by minimizing an M3D effect such as MSD, the embodiments may be implemented for minimizing other M3D effects.

It is often desirable to be able computationally determine how a patterning process would produce a desired pattern on a substrate. Computational determination may comprise simulation and/or modeling, for example. Models and/or simulations may be provided for one or more parts of the manufacturing process. For example, it is desirable to be able to simulate the lithography process of transferring the patterning device pattern onto a resist layer of a substrate as well as the yielded pattern in that resist layer after development of the resist, simulate metrology operations such as the determination of overlay, and/or perform other simulations. The objective of a simulation may be to accurately predict, for example, metrology metrics (e.g., overlay, a critical dimension, a reconstruction of a three dimensional profile of features of a substrate, a dose or focus of a lithography apparatus at a moment when the features of the substrate were printed with the lithography apparatus, etc.), manufacturing process parameters (e.g., edge placements, aerial image intensity slopes, sub resolution assist features (SRAF), etc.), and/or other information which can then be used to determine whether an intended or target design has been achieved. The intended design is generally defined as a pre-optical proximity correction design layout which can be provided in a standardized digital file format such as GDSII, OASIS or another file format.

Various optimization methods may be used for achieving pattern fidelity. Simulation and/or modeling can be used to determine one or more metrology metrics (e.g., performing overlay and/or other metrology measurements), configure one or more features of the patterning device pattern (e.g., performing optical proximity correction (OPC)), configure one or more features of the illumination (e.g., changing one or more characteristics of a spatial/angular intensity distribution of the illumination, such as change a shape), configure one or more features of the projection optics (e.g., numerical aperture, etc.), and/or for other purposes. Such determination and/or configuration can be generally referred to as mask optimization, source optimization, and/or projection optimization, for example. Such optimizations can be performed on their own, or combined in different combinations. One such example is source-mask optimization (SMO), which involves the configuring of one or more features of the patterning device pattern (e.g., OPC) together with one or more features of the illumination. The optimizations may use the parameterized model described herein to predict values of various parameters (including images, etc.), for example.

In some embodiments, OPC is a photolithography enhancement technique used to compensate for image errors due to diffraction or process effects. The OPC process configures features of a pattern to correct errors (e.g., irregularities such as line widths that are narrower or wider than designed, distortions such as rounded corners, etc.) caused due to the limitations of light. For example, the OPC process may move edges or add extra polygons to the pattern written on the mask. OPC may be implemented in various ways, e.g., using rule based OPC which is be driven by pre-computed look-up tables based on width and spacing between features, or using simulation models that dynamically simulate the final pattern for a given mask pattern. The objective is to reproduce on the semiconductor wafer, as well as possible, the original layout drawn by the designer.

In some embodiments, SMO is an optimization process in which one or more features of the illumination, such as source radiation intensity, pupil fill ratio (e.g., namely percentage of radiation of the source that passes through a pupil or aperture), magnitude and phase of diffraction orders, etc. are optimized along with one or more features of the mask pattern (e.g., OPC.)

In some embodiments, an optimization process of a system may be represented as a cost function. The optimization process may comprise finding a set of parameters (design variables, process variables, inspection operation variables, etc.) of the system that minimizes the cost function. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, or resist characteristics can be among the design variables in the optimization. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics. The cost function may often be a non-linear function of the design variables. Then standard optimization techniques may be used to minimize the cost function.

Figure 10:
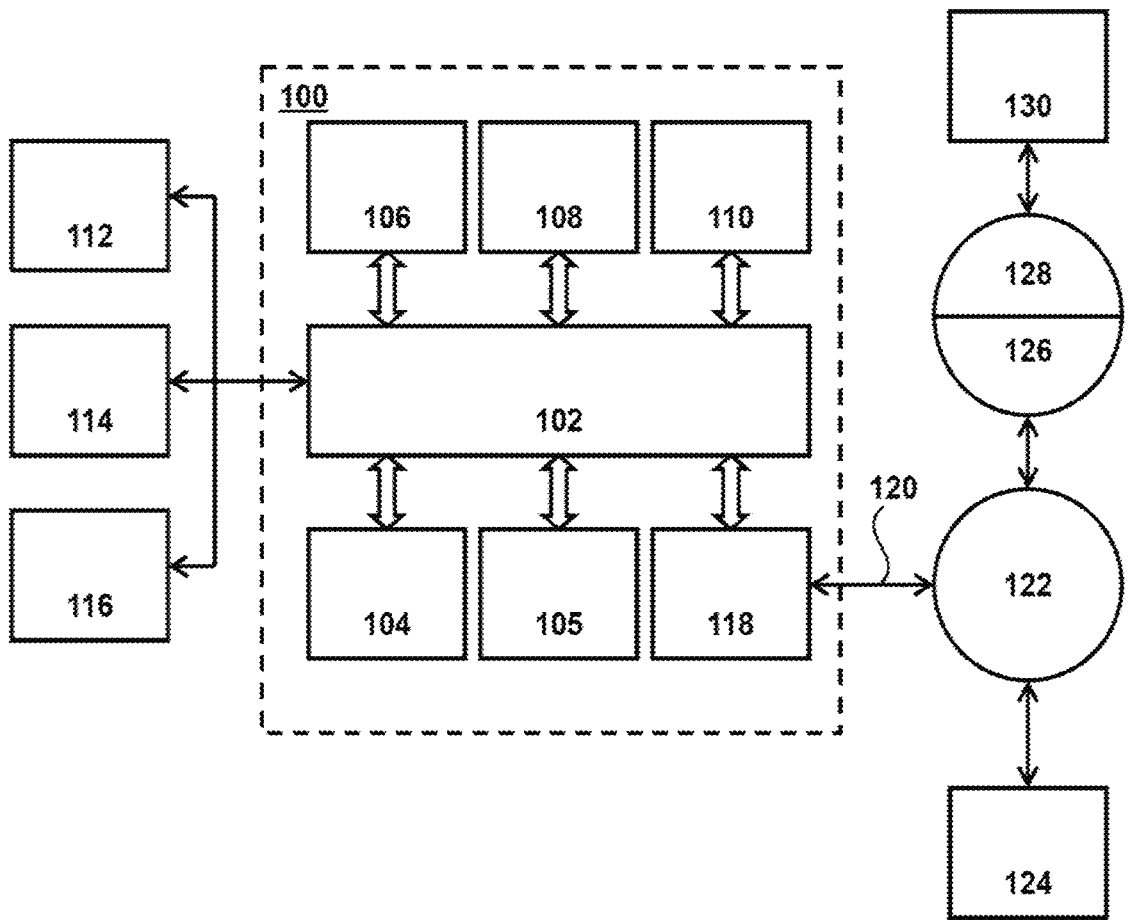
FIG. 10 is a block diagram of an example computer system, according to an embodiment.

FIG. 10 is a block diagram that illustrates a computer system 100 which can assist in implementing in various methods and systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, or stored in storage device 110, or other non-volatile storage for later execution. In this manner, computer system 100 may obtain application code in the form of a carrier wave.

Figure 11:
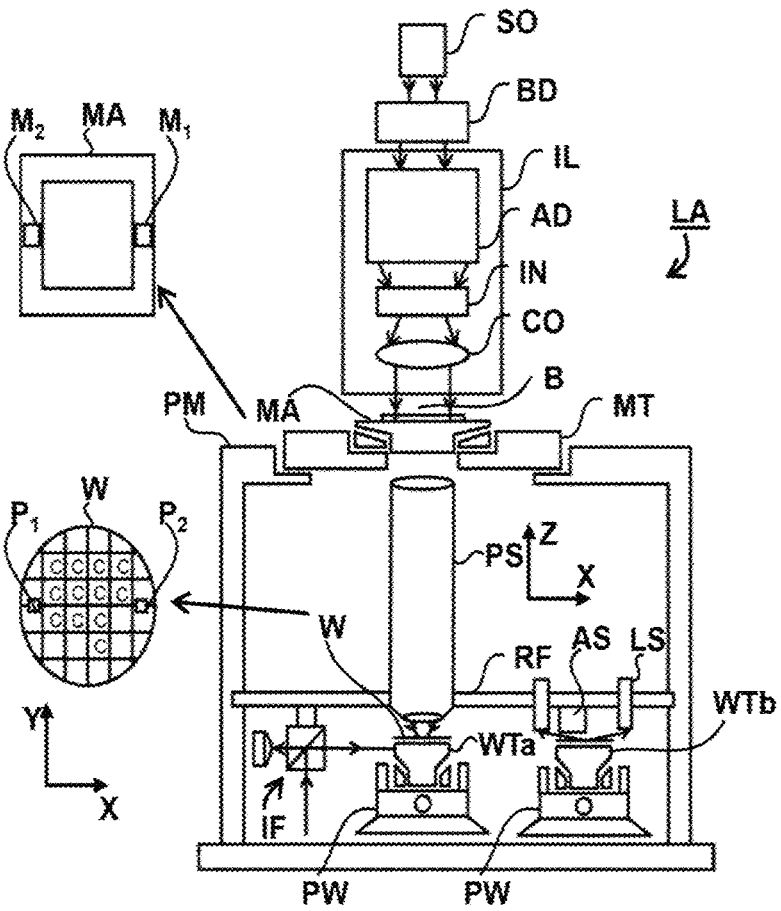
FIG. 11 is a schematic diagram of a lithographic projection apparatus, according to an embodiment.

FIG. 11 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
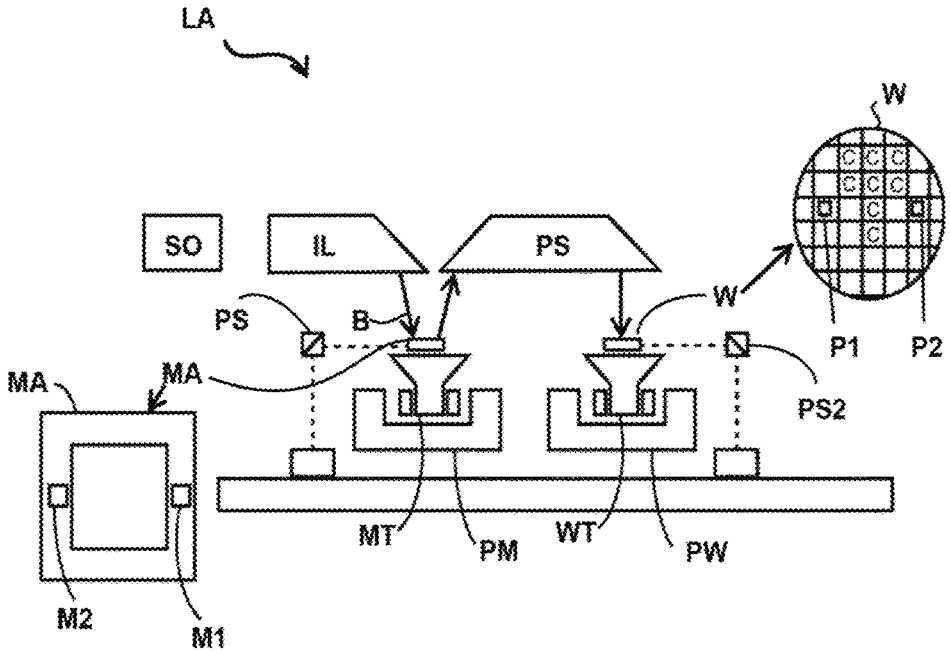
FIG. 12 is a schematic diagram of another lithographic projection apparatus, according to an embodiment.

FIG. 12 schematically depicts another exemplary lithographic projection apparatus LA whose illumination source could be optimized utilizing the methods described herein.

The lithographic projection apparatus LA includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 12, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
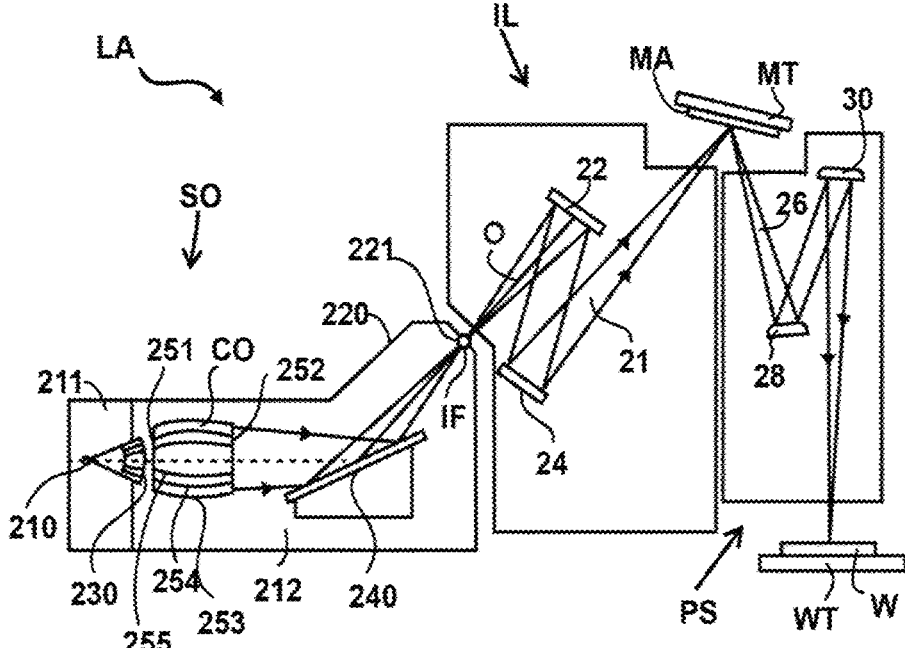
FIG. 13 is a more detailed view of the apparatus in FIG. 11, according to an embodiment.

FIG. 13 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 14:
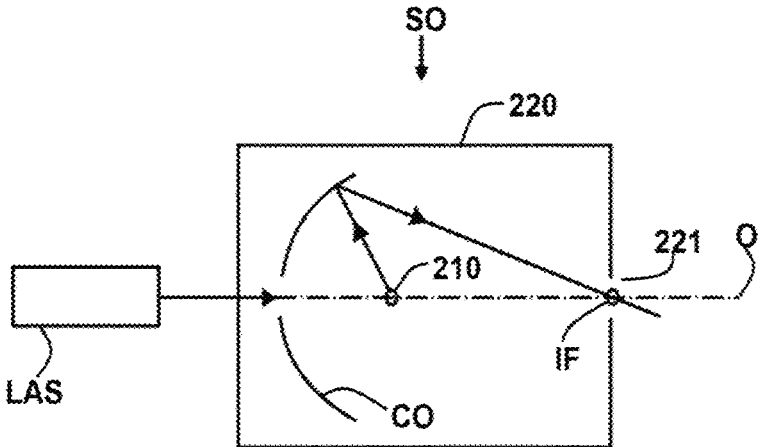
FIG. 14 is a more detailed view of the source collector module SO of the apparatus of FIG. 12 and FIG. 13, according to an embodiment.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Further embodiments of the invention are disclosed in the list of numbered clauses below:

1. A non-transitory computer-readable medium having instructions that, when executed by a computer, cause the computer to execute a method for improving imaging of a feature on a mask to a substrate during a scanning operation of a lithographic apparatus, the method comprising: obtaining a dynamic pupil representing evolution of an angular distribution of an intensity of radiation exposing a mask during a scanning operation of the lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

2. The computer-readable medium of clause 1, wherein determining the variation of shift of the feature includes: obtaining an intensity map of the dynamic pupil, wherein the intensity map is representative of an angular distribution of an intensity of the radiation from an illumination source of the lithographic apparatus at multiple moments during the scanning operation; obtaining multiple pupils forming the dynamic pupil, wherein each pupil of the multiple pupils (a) corresponds to an angular distribution of an intensity of the radiation at the mask, and (b) is obtained at a different moment of the multiple moments; obtaining multiple aerial images of the feature for the multiple pupils, wherein each aerial image of the multiple aerial images is (a) obtained for a different pupil of the multiple pupils, and (b) associated with an angular distribution of the intensity of the radiation at the mask at the moment the corresponding pupil is obtained; and determining the variation of shift of the feature based on determined individual shifts of each of the aerial images relative to their respective nominal positions.

3. The computer-readable medium of clause 2, wherein the intensity map is determined in a scanning direction of the lithographic apparatus.

4. The computer-readable medium of clause 2, wherein determining the variation of the shift of the feature includes: obtaining a first pupil, a second pupil and a third pupil at different moments of the scanning operation, wherein the first pupil corresponds to an angular distribution of the radiation at the mask from a first pole of the illumination source, wherein the second pupil corresponds to an angular distribution of the intensity of the radiation at the mask from a second pole of the illumination source, and wherein the third pupil corresponds to an angular distribution of the intensity of the radiation at the mask from the first pole and the second pole of the illumination source; obtaining a first aerial image, a second aerial image, and a third aerial image for the first pupil, the second pupil and the third pupil, respectively, wherein the first aerial image is associated with an angular distribution of the intensity of the radiation at the mask at a time the first pupil is obtained, wherein the second aerial image is associated with an angular distribution of the intensity of the radiation at the mask at the time the second pupil is obtained, and wherein the third aerial image is associated with an angular distribution of the intensity of the radiation at the mask at the time the third pupil is obtained; and determining the variation of shift of the feature based on a shift in a center of gravity of each of the aerial images relative to a nominal center of gravity in the intensity map.

5. The computer-readable medium of clause 1, wherein the variation of shift of the feature is indicative of a displacement variation of the feature at the substrate around an intended position of the feature according to a design layout.

6. The computer-readable medium of clause 1, wherein configuring the control parameter includes: configuring a tilt of a reticle stage of the lithographic apparatus holding the mask to reduce the variation of shift of the feature.

7. The computer-readable medium of clause 6 further comprising: determining an overlay error introduced due to the tilt of the reticle stage; and configuring a design of the mask to compensate the overlay error.

8. The computer-readable medium of clause 6 further comprising: determining a focus error introduced due to the tilt of the reticle stage; and configuring a wafer stage of the lithographic apparatus to compensate the focus error.

9. The computer-readable medium of clause 6 further comprising: determining, from an aerial image associated with the feature, an image parameter that is representative of blurring, fading, or loss of contrast; and configuring the tilt of the reticle stage to minimize the image parameter.

10. The computer-readable medium of clause 9, wherein the image parameter includes moving standard deviation.

11. The computer-readable medium of clause 10, wherein the moving standard deviation is determined as a function of the shift of the feature and a pole intensity of multiple poles of an illumination source of the lithographic apparatus.

12. The computer-readable medium of clause 1, wherein configuring the control parameter includes configuring an illumination source of the lithographic apparatus.

13. The computer-readable medium of clause 1, wherein configuring the control parameter includes configuring a projection lens of the lithographic apparatus.

14. The computer-readable medium of clause 1, wherein configuring the mask parameter includes configuring a bias of the mask.

15. The computer-readable medium of clause 1, wherein configuring the control parameter or the mask parameter includes configuring a bias of the mask along with an illumination source of the lithographic apparatus.

16. The computer-readable medium of clause 1, wherein configuring the control parameter or the mask parameter includes configuring at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

17. The computer-readable medium of clause 1, wherein the mask includes a plurality of features to be imaged on the substrate, and wherein the at least one of the mask parameter or the control parameter is configured based on a combination of variation of shifts of the plurality of features.

18. The computer-readable medium of clause 1, wherein the angular distribution of the intensity of radiation includes a static distribution of the intensity of radiation from one or more poles of an illumination source, wherein the static distribution does not vary as much as the angular distribution of the intensity of radiation from other poles of the illumination source.

19. A non-transitory computer-readable medium having instructions that, when executed by a computer, cause the computer to execute a method for improving imaging of a feature on a mask to a substrate during scanning operation of a lithographic apparatus, the method comprising: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

20. The computer-readable medium of clause 19, wherein configuring the lithographic process parameter includes configuring the lithographic process dynamically as a function of time during the scanning operation.

21. A computer-implemented method for improving imaging of a feature on a mask to a substrate during a scanning operation of a lithographic apparatus, the method comprising: obtaining a dynamic pupil representing evolution of an angular distribution of an intensity of radiation exposing a mask during a scanning operation of a lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

22. The method of clause 21, wherein determining the variation of shift of the feature includes: obtaining an intensity map of the dynamic pupil, wherein the intensity map is representative of an angular distribution of an intensity of the radiation from an illumination source of the lithographic apparatus at multiple moments during the scanning operation; obtaining multiple pupils forming the dynamic pupil, wherein each pupil of the multiple pupils (a) corresponds to an angular distribution of an intensity of the radiation at the mask, and (b) is obtained at a different moment of the multiple moments; obtaining multiple aerial images of the feature for the multiple pupils, wherein each aerial image of the multiple aerial images is (a) obtained for a different pupil of the multiple pupils, and (b) associated with an angular distribution of the intensity of the radiation at the mask at the moment the corresponding pupil is obtained; and determining the variation of shift of the feature based on determined individual shifts of each of the aerial images relative to their respective nominal positions.

23. The method of clause 22, wherein the intensity map is determined in a scanning direction of the lithographic apparatus.

24. The method of clause 22, wherein determining the variation of the shift of the feature includes:

obtaining a first pupil, a second pupil and a third pupil at different moments of the scanning operation, wherein the first pupil corresponds to an angular distribution of the intensity of the radiation at the mask from a first pole of the illumination source, wherein the second pupil corresponds to an angular distribution of the intensity of the radiation at the mask from a second pole of the illumination source, and wherein the third pupil corresponds to an angular distribution of the intensity of the radiation at the mask from the first pole and the second pole of the illumination source; obtaining a first aerial image, a second aerial image, and a third aerial image for the first pupil, the second pupil and the third pupil, respectively, wherein the first aerial image is associated with an angular distribution of the intensity of the radiation at the mask at a time the first pupil is obtained, wherein the second aerial image is associated with an angular distribution of the intensity of the radiation at the mask at the time the second pupil is obtained, and wherein the third aerial image is associated with an angular distribution of the intensity of the radiation at the mask at the time the third pupil is obtained; and determining the variation of shift of the feature based on a shift in a center of gravity of each of the aerial images relative to a nominal center of gravity in the intensity map.

25. The method of clause 21, wherein the variation of shift of the feature is indicative of a displacement variation of the feature at the substrate around an intended position of the feature according to a design layout.

26. The method of clause 21, wherein configuring the control parameter includes:

configuring a tilt of a reticle stage of the lithographic apparatus holding the mask to reduce the variation of shift of the feature.

27. The method of clause 26 further comprising: determining an overlay error introduced due to the tilt of the reticle stage; and configuring a design of the mask to compensate the overlay error.

28. The method of clause 26 further comprising: determining a focus error introduced due to the tilt of the reticle stage; and configuring a wafer stage of the lithographic apparatus to compensate the focus error.

29. The method of clause 26 further comprising: determining, from an aerial image associated with the feature, an image parameter that is representative of blurring, fading, or loss of contrast; and configuring the tilt of the reticle stage to minimize the image parameter.

30. The method of clause 29, wherein the image parameter includes moving standard deviation.

31. The method of clause 30, wherein the moving standard deviation is determined as a function of the shift of the feature and a pole intensity of multiple poles of an illumination source of the lithographic apparatus.

32. The method of clause 21, wherein configuring the control parameter includes configuring an illumination source of the lithographic apparatus.

33. The method of clause 21, wherein configuring the control parameter includes configuring a projection lens of the lithographic apparatus.

34. The method of clause 21, wherein configuring the mask parameter includes configuring a bias of the mask.

35. The method of clause 21, wherein configuring the control parameter or the mask parameter includes configuring a bias of the mask along with an illumination source of the lithographic apparatus.

36. The method of clause 21, wherein configuring the control parameter or the mask parameter includes configuring at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

37. The method of clause 21, wherein the mask includes a plurality of features to be imaged on the substrate, and wherein the at least one of the mask parameter or the control parameter is configured based on a combination of variation of shifts of the plurality of features.

38. The method of clause 21, wherein the angular distribution of the intensity of radiation includes a static distribution of the intensity of radiation from one or more poles of an illumination source, wherein the static distribution does not vary as much as the angular distribution of the intensity of radiation from other poles of the illumination source.

39. A method for improving imaging of a feature on a mask to a substrate during scanning operation of a lithographic apparatus, the method comprising: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

40. An apparatus for improving imaging of a feature on a mask to a substrate during a scanning operation of a lithographic apparatus, the apparatus comprising: a memory storing a set of instructions; and a processor configured to execute the set of instructions to cause the apparatus to perform a method of: obtaining a dynamic pupil representing evolution of an angular distribution of an intensity of radiation exposing a mask during a scanning operation of a lithographic apparatus; determining a variation of shift of a feature at a substrate during the scanning operation due to interaction of the dynamic pupil with the mask; and configuring at least one of a mask parameter or a control parameter of the lithographic apparatus to reduce the variation of shift of the feature.

41. An apparatus for a method for improving imaging of a feature on a mask to a substrate during scanning operation of a lithographic apparatus, the apparatus comprising: a memory storing a set of instructions; and a processor configured to execute the set of instructions to cause the apparatus to perform a method of: obtaining a dynamic pupil representing evolution of an angular distribution of radiation exposing a mask during a scanning operation of a lithographic apparatus; determining a variation of shift of a feature at a substrate during the scanning operation due to interaction of the dynamic pupil with the mask; and configuring a lithographic process related parameter to reduce the variation of shift of the feature, wherein the lithographic process related parameter includes at least one of a design of the mask, a reticle stage of the lithographic apparatus holding the mask, a wafer stage of the lithographic apparatus holding the substrate, an illumination source of the lithographic apparatus, or a projection lens of the lithographic apparatus.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C. Expressions such as "at least one of" do not necessarily modify an entirety of a following list and do not necessarily modify each member of the list, such that "at least one of A, B, and C" should be understood as including only one of A, only one of B, only one of C, or any combination of A, B, and C. The phrase "one of A and B" or "any one of A and B" shall be interpreted in the broadest sense to include one of A, or one of B.

The descriptions above are intended to be illustrative, not limiting. Thus, it will be apparent to one skilled in the art that modifications may be made as described without departing from the scope of the claims set out below.

The invention claimed is:

1. A non-transitory computer-readable medium having instructions that, when executed by a computer system, are configured to cause the computer system to at least:

obtain a dynamic pupil representing evolution of an angular distribution of an intensity of radiation to expose a mask during a scanning operation of a lithographic apparatus;

determine a variation of shift of a feature at a substrate during the scanning operation due to interaction of the dynamic pupil with the mask; and configure a mask parameter and/or a control parameter of the lithographic apparatus, to reduce the variation of shift of the feature.

2. The computer-readable medium of claim 1, wherein the instructions configured to cause the computer system to determine the variation of shift of the feature are further configured to cause the computer system to:

obtain an intensity map of the dynamic pupil, wherein the intensity map is representative of an angular distribution of an intensity of the radiation of an illumination within the lithographic apparatus at multiple moments during the scanning operation;

obtain multiple pupils forming the dynamic pupil, wherein each pupil of the multiple pupils (a) corresponds to an angular distribution of an intensity of the radiation at the mask, and (b) is obtained at a different moment of the multiple moments;

obtain multiple aerial images of the feature for the multiple pupils, wherein each aerial image of the multiple aerial images is (a) obtained for a different pupil of the multiple pupils, and (b) associated with an angular distribution of the intensity of the radiation at the mask at the moment the corresponding pupil is obtained; and determine the variation of shift of the feature based on determined individual shifts of each of the aerial images relative to their respective nominal positions.

3. The computer-readable medium of claim 2, wherein the intensity map is determined in a scanning direction of the lithographic apparatus.

4. The computer-readable medium of claim 2, wherein the instructions configured to cause the computer system to determine the variation of the shift of the feature are further configured to cause the computer system to:

obtain a first pupil, a second pupil and a third pupil at different moments of the scanning operation, wherein the first pupil corresponds to an angular distribution of the intensity of the radiation at the mask from a first pole of the illumination, wherein the second pupil corresponds to an angular distribution of the intensity of the radiation at the mask from a second pole of the illumination, and wherein the third pupil corresponds to an angular distribution of the intensity of the radiation at the mask from the first pole and the second pole of the illumination;

obtain a first aerial image, a second aerial image, and a third aerial image for the first pupil, the second pupil and the third pupil, respectively, wherein the first aerial image is associated with an angular distribution of the intensity of the radiation at the mask at a time the first pupil is obtained, wherein the second aerial image is associated with an angular distribution of the intensity of the radiation at the mask at the time the second pupil is obtained, and wherein the third aerial image is associated with an angular distribution of the intensity of the radiation at the mask at the time the third pupil is obtained; and determine the variation of shift of the feature based on a shift in a center of gravity of each of the aerial images relative to a nominal center of gravity in the intensity map.

5. The computer-readable medium of claim 1, wherein the variation of shift of the feature is indicative of a displacement variation of the feature at the substrate around an intended position of the feature according to a design layout.

6. The computer-readable medium of claim 1, wherein the instructions configured to cause the computer system to configure the control parameter are further configured to cause the computer system to configure a tilt of a reticle stage of the lithographic apparatus holding the mask to reduce the variation of shift of the feature.

7. The computer-readable medium of claim 6, wherein the instructions are further configured to cause the computer system to:

determine an overlay error introduced due to the tilt of the reticle stage; and configure a design of the mask to compensate for the overlay error.

8. The computer-readable medium of claim 6, wherein the instructions are further configured to cause the computer system to:

determine a focus error introduced due to the tilt of the reticle stage; and configure a wafer stage of the lithographic apparatus to compensate for the focus error.

9. The computer-readable medium of claim 6, wherein the instructions are further configured to cause the computer system to:

determine, from an aerial image associated with the feature, an image parameter that is representative of blurring, fading, or loss of contrast; and configure the tilt of the reticle stage to reduce or minimize the image parameter.

10. The computer-readable medium of claim 9, wherein the image parameter includes moving standard deviation.

11. The computer-readable medium of claim 10, wherein the moving standard deviation is determined as a function of the shift of the feature and a pole intensity of multiple poles of an illumination within the lithographic apparatus.

12. The computer-readable medium of claim 1, wherein the instructions configured to cause the computer system to configure the control parameter are further configured to cause the computer system to configure an illumination within the lithographic apparatus.

13. The computer-readable medium of claim 1, wherein the instructions configured to cause the computer system to configure the control parameter are further configured to cause the computer system to configure a projection lens of the lithographic apparatus.

14. The computer-readable medium of claim 1, wherein the instructions configured to cause the computer system to configure the mask parameter are further configured to cause the computer system to configure a bias of the mask.

15. The computer-readable medium of claim 1, wherein the instructions configured to cause the computer system to configure the control parameter or the mask parameter are further configured to cause the computer system to configure at least one selected from: a design of the mask, a reticle stage of the lithographic apparatus holding the mask, a wafer stage of the lithographic apparatus holding the substrate, an illumination within the lithographic apparatus, or a projection lens of the lithographic apparatus.

16. A computer-implemented method for improving imaging of a feature on a mask to a substrate during a scanning operation of a lithographic apparatus, the method comprising:

obtain a dynamic pupil representing evolution of an angular distribution of an intensity of radiation to expose a mask during a scanning operation of a lithographic apparatus;

determine a variation of shift of a feature at a substrate during the scanning operation due to interaction of the dynamic pupil with the mask; and configure a mask parameter and/or a control parameter of the lithographic apparatus, to reduce the variation of shift of the feature.

17. The method of claim 16, wherein configuring the control parameter or the mask parameter includes configuring at least one selected from: a design of the mask, a reticle stage of the lithographic apparatus holding the mask, a wafer stage of the lithographic apparatus holding the substrate, an illumination within the lithographic apparatus, or a projection lens of the lithographic apparatus.

18. The method of claim 16, wherein determining the variation of shift of the feature includes:

obtaining an intensity map of the dynamic pupil, wherein the intensity map is representative of an angular distribution of an intensity of the radiation of an illumination within the lithographic apparatus at multiple moments during the scanning operation;

obtaining multiple pupils forming the dynamic pupil, wherein each pupil of the multiple pupils (a) corresponds to an angular distribution of an intensity of the radiation at the mask, and (b) is obtained at a different moment of the multiple moments;

obtaining multiple aerial images of the feature for the multiple pupils, wherein each aerial image of the multiple aerial images is (a) obtained for a different pupil of the multiple pupils, and (b) associated with an angular distribution of the intensity of the radiation at the mask at the moment the corresponding pupil is obtained; and determining the variation of shift of the feature based on determined individual shifts of each of the aerial images relative to their respective nominal positions.

19. A method for improving imaging of a feature on a mask to a substrate during scanning operation of a lithographic apparatus, the method comprising:

obtaining a dynamic pupil representing evolution of an angular distribution of radiation to expose the mask during scanning operation of the lithographic apparatus;

determining, by a hardware computer system, a variation of shift of a feature at a substrate during the scanning operation due to interaction of the dynamic pupil with the mask; and configuring a lithographic process related parameter to reduce the variation of shift of the feature, wherein the lithographic process related parameter includes at least one selected from: a design of the mask, a reticle stage of the lithographic apparatus holding the mask, a wafer stage of the lithographic apparatus holding the substrate, an illumination within the lithographic apparatus, or a projection lens of the lithographic apparatus.

20. A non-transitory computer-readable medium having instructions that, when executed by a computer system, are configured to cause the computer system to at least perform the method of claim 19.

* * * * *